United States Patent [19]

Lamb

[11] Patent Number: 5,043,934

[45] Date of Patent: Aug. 27, 1991

[54] LOOKAHEAD ADDER WITH UNIVERSAL LOGIC GATES

[75] Inventor: Joel D. Lamb, Fort Collins, Colo.

[73] Assignee: Hewlett-Packard Company, Palo Alto, Calif.

[21] Appl. No.: 480,188

[22] Filed: Feb. 13, 1990

[51] Int. Cl.⁵ ............................................. G06F 7/50
[52] U.S. Cl. .................................... 364/787; 364/784
[58] Field of Search ........................ 364/784, 786–788

[56] References Cited

U.S. PATENT DOCUMENTS 4,163,211 7/1979 Miura .............................. 364/787 X
4,600,846 7/1986 Burrows .......................... 364/784 X Primary Examiner—Dale M. Shaw
Assistant Examiner—Tan V. Mai

[57] ABSTRACT

A lookahead adder with identical logic gates in all but the first of its lookahead sections. All such identical gates implement the logic function $M = X + Y \cdot Z$.

10 Claims, 9 Drawing Sheets

CLA1-G $G1 = A \cdot B$

CLA1-P $P1 = A + B$

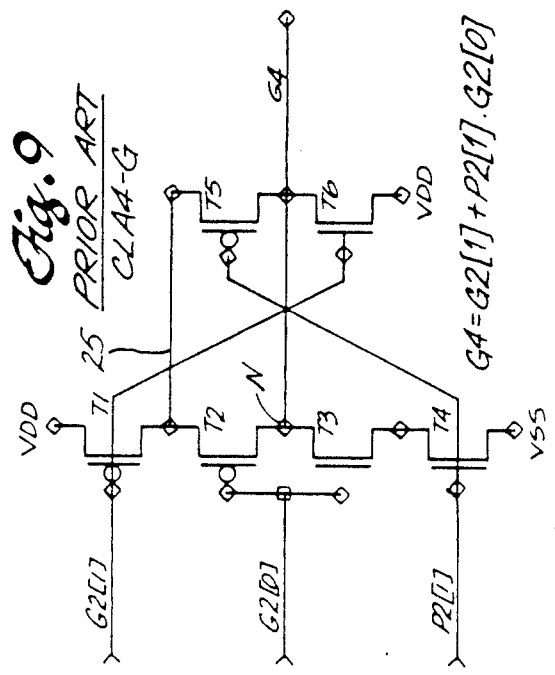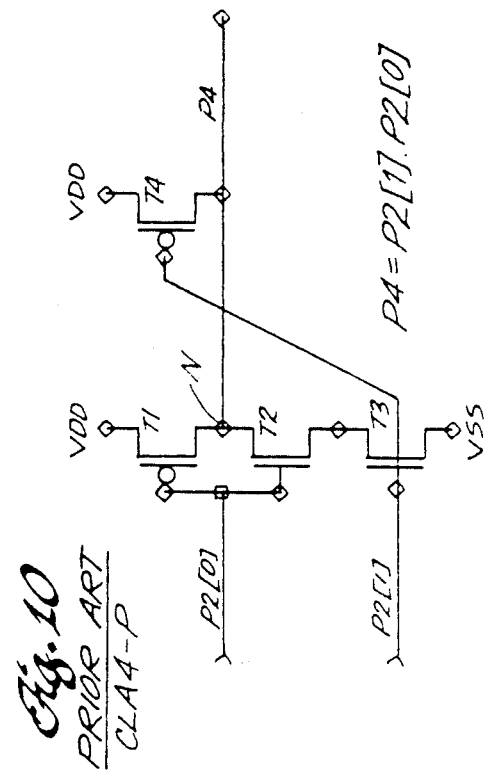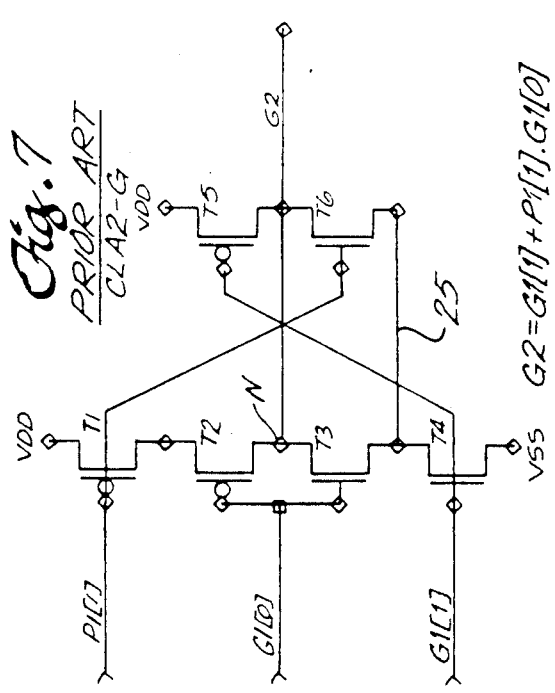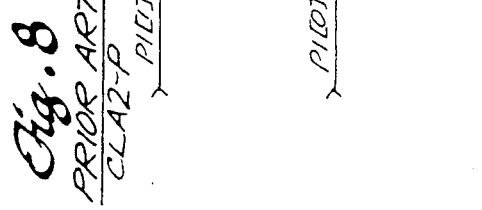

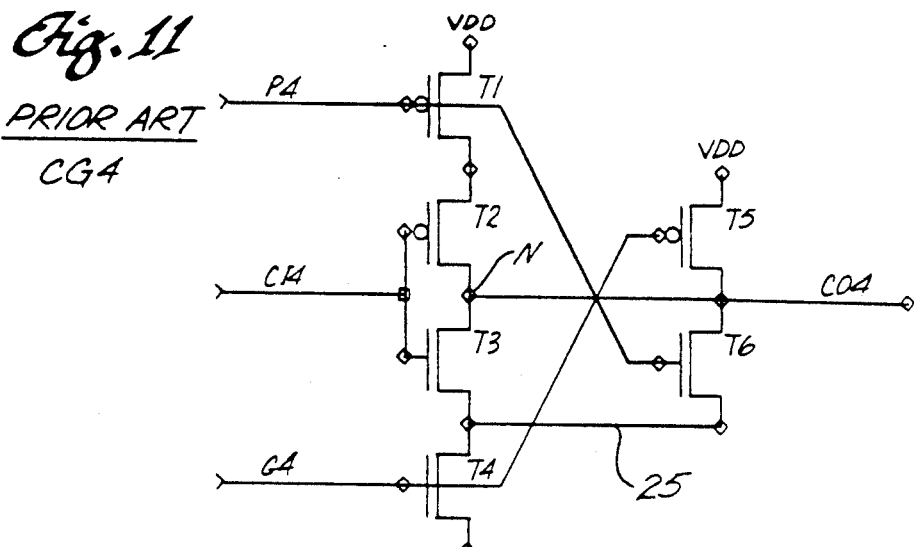
Fig.11 PRIOR ART CG4
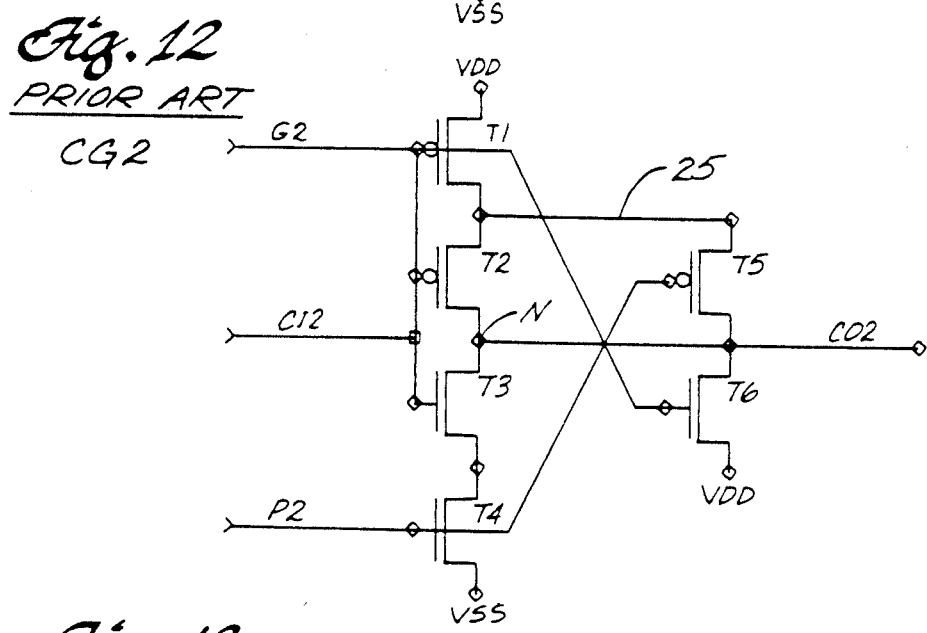
Fig.12 PRIOR ART CG2
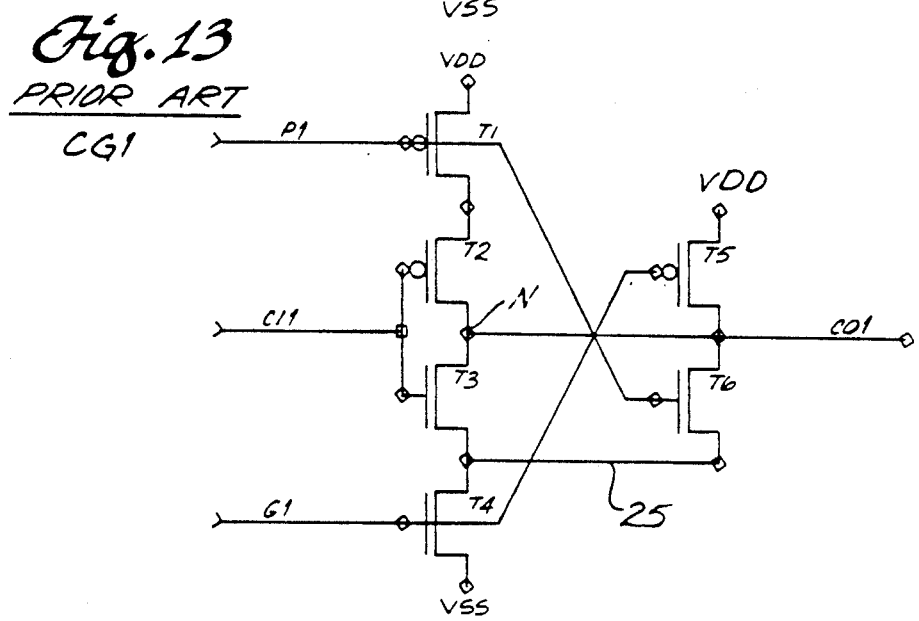
Fig.13 PRIOR ART CG1

MCLA4-G

MCLA4-P

MCLA2-G
$G2 = G1[1] + P1[1] \cdot G1[0]$

MCLA2-P
$P2 = G1[1] + P1[1] \cdot P1[0]$

5,043,934

LOOKAHEAD ADDER WITH UNIVERSAL LOGIC GATES

BACKGROUND OF THE INVENTION

The present invention is directed to binary adders and, in particular, to an improvement in the gate circuits of lookahead binary adders.

The simplest form of binary adder is the ripple-carry binary adder. It has a plurality of stages—one stage for each bit of a pair of binary numbers A and B that are to be added. Each adder stage produces two outputs: a Sum (S) and a Carry (C). The S output constitutes one of the plurality of outputs of the adder which signals the result of the addition. The C output is a carry bit, which is applied to the next-higher stage of the adder. The S output of each stage is a function of the A, B, and C inputs thereto. Whereas the A and B inputs to the adder are simultaneously available at the beginning of the add operation, the C signals are not. They ripple through successive stages of the adder, from least to most significant bit, as each stage performs its addition. The resultant delay makes ripple-carry adders relatively slow.

Lookahead binary adders improve upon the speed of ripple-carry binary adders by providing additional circuitry, dedicated to derive C signals directly from the A and B inputs. The additional circuitry comprises two main sections: a Generate/Propagate (G/P) section and a Carry-Generate (C-G) section. The G/P section itself comprises a plurality of logic circuits arranged in a series of stages, circuits in successive lookahead stages being associated with subgroups of progressively larger numbers of bits (i.e., 2, 4, 8, etc.) or adder stages. It is the function of the G/P sections to derive from the A and B inputs to the adder a set of Generate (G) and Propagate (P) signals, such G and P signals being generated for groups of 1, 2, 4, 8, etc. adder stages, up to the largest group, whose members number one-half of the total number of stages in the adder.

The other principal portion of the lookahead logic is the C-G section, which serves to derive, from the G and P signals, C signals for each stage of the adder in lieu of the C signals which would otherwise be generated by the respective adder stages themselves. As noted above, the advantage of the arrangement is that the C signals so produced can be generated much more quickly than in the ripple-carry adder.

In the G/P section of the lookahead logic, the logic circuits in the first stage receive inputs A and B from respective ones of the adder stages. Their respective outputs are expressed by the following equations:

$$G1 = A \cdot B \tag{1}$$

$$P1 = A + B \tag{2}$$

In the second stage of the adder, the logic circuits implement the following relationships:

$$G2 = G1[1] + P1[1] \cdot G1[0] \tag{3}$$

$$P2 = P1[1] \cdot P1[0] \tag{4}$$

In equations (3) and (4), the first number after a letter reflects that the G or P term is an output from the first stage of the lookahead section. The second number after a letter (in brackets), which in the above equations is either a 1 or a 0, identifies which of the two members of the previous stage generated the term in question. It will be recalled that each such stage receives G and P outputs from two members of the previous stage of the G/P section, the less significant bit of the two being responsible for the terms identified with the [0], and the more significant bit of the two being responsible for the [1] terms of the next-higher-order section.

In the C-G section of the lookahead logic, each stage comprises logic circuits which receive as their inputs a C signal and G and P signals from a respective stage of the G/P section. Each C-G section circuit implements the relationship:

$$CO_x = G_x + P_x \cdot CI_x \tag{5}$$

where x is the C/P stage with which the particular C-G stage is associated.

Lookahead adders and their lookahead logic for fast-carry generation are well known, and for a more complete understanding of their operation, the reader is referred to the literature, among which is Waser et al, *Introduction to Arithmetic for Digital Systems Designers*, Section 3.1.3, pp. 83-88, published by Holt, Rinehart and Winston.

The logic circuits for implementing equations (1)-(5) are usually constructed of Field Effect Transistor (FET) switches having a source, a drain, and a gate. FET's, are switched, closed or open, by a signal on their gate. When switched closed, an FET provides a low-impedance current path between its source and its drain. When switched open, the FET breaks that path.

The present invention is concerned, in particular, with the presently used configuration of the logic circuits for implementing equations (3), (4), and (5). These circuits typically comprise first and second branches of series-connected FET's connected in parallel such as $V_{SS}$ and $V_{DD}$. The circuit has an output node, and the first and second branches each comprise first and second legs (or sub-branches), the respective legs in each branch being connected between respective ones of the first and second reference potentials and the output node. Each leg of the first branch comprises first and second series-connected FET's, the first FET of each pair being connected to a respective one of the reference potentials, and the second FET of each pair being connected between the first FET of each pair and the output node. Each leg of the second branch comprises a single FET, one of which is connected between the output node and one of the reference potentials, the other of which is connected between the output node and the junction between the FET's of one of the legs in the first branch of the circuit.

The last of the above-described connections has two disadvantages. First, it is undesirable from a circuit layout standpoint. Second, it puts an FET in the second branch in parallel with one of the two series-connected FET's in the first branch. The two parallel-connected transistors are then connected in series between the node and one of the reference potentials, through the other of the series-connected first-branch FET's. In order to maintain uniform circuit speed, it is necessary that the member of the parallel-connected FET pair which is in the second branch have the same resistance as its mate in the first branch. This, in turn, implies that the two parallel-connected FET's must be of comparable size.

SUMMARY OF THE INVENTION

In accordance with the invention, the cross-connection between the second and first branches of a prior-art Generate (G) gate is eliminated, and the FET in the second branch, which had previously been connected to the junction point of the two series-connected FET's in the first branch, is connected directly to one of the reference potentials. As a result, the second branch comprises two legs, each of which includes a single FET connected between a respective one of the reference potentials and the output node. This puts each FET of the second branch in parallel with the series-connected pair of FET's in a respective leg of the first branch. Since the resistance of the second branch FET whose connection is so changed now needs to match only the resistance of the series-connected pair of FET's in the first branch with which it is connected in parallel, its resistance may be significantly higher, and, hence, its size may be significantly smaller than previously required. By reducing the size of the FET and eliminating the connection as explained, not only is the circuit made simpler and smaller, it is also made faster, by reducing the capacitance as a result of reducing FET size.

Without more, the above-described modification could result in a condition called "drive fight," in which, under certain conditions, the FET's in the respective legs of the second branch both conduct, thus rendering indeterminate the logical state of the output node. This is so because the logical state of the output node is either a logical 0, when one, and only one, of the second-branch FET's conducts, or a logical 1, if only the other of those FET's conducts, since, depending on which of the two FET's conducts, the output node will be at the reference potential to which the conducting FET is connected.

In carrying out the present invention, an additional modification is made in the Propagate (P) circuits, which create the P signals. In current lookahead logic for implementing equation (4) for P2, the circuit comprises first and second branches, the first of which includes a first leg having a pair of FET's connected in series between the output node of the circuit and the first reference potential and a second leg having a single FET connected in series between the output node and the other reference potential. The second branch comprises a single FET having a single leg connected between the output node and the second reference potential. It has been discovered that, by providing a second term to the expression for P, such that, for a P2 circuit of the second stage, for example:

$$P2 = G1[1] + P1[1] \cdot P1[0] \quad (6)$$

the possibility of a combination of inputs which might result in drive fight is eliminated. The additional term, which in the case of equation (6) is $G1[1]$, is implemented in accordance with the invention by the addition of a second FET in series with the previously single transistor in the second leg of the first branch, and further by the addition of a second leg in the second branch, connected between the output node of the circuit and the reference potential to which the existing leg of the second branch is not connected. The resulting circuit will be found to correspond exactly to the G circuit to which the P circuit feeds its output.

A further significant advantage of the invention is that, whereas previously the G circuits in successive stages differed in their geometries by virtue of the opposite conductivity types of their transistors, in the circuit as modified in the present invention, only their inputs need to be reversed, and their geometries may be identical. Accordingly, not only have the P circuits been made identical to the G circuits, but all G circuits have been made alike as well. As a result, the lookahead adder of the prior art has been significantly simplified because, instead of four differently-configured circuits in its lookahead section (2G and 2P circuits), there is now provided a universal circuit configuration which can serve in place of any of the four circuits previously used. As will be seen from the Detailed Description, the same simplification is also effected in the C-G section, whereby all circuits of both sections, G/P and C-G may be alike, except for the first stage of the G/P section.

Thus, in its first aspect, the invention provides a lookahead adder having a lookahead logic section whose individual logic circuits may be identical for all but the initial lookahead stage.

In its second aspect, the invention provides a universal circuit for a lookahead adder, that circuit comprising an output node, first and second branches of series-connected FET's connected in parallel between first and second sources of reference potential, the first and second branches each comprising first and second legs, the respective legs in each branch being connected between respective ones of the first and second reference potentials and the output node, at least one FET in each leg of the second branch having its gate connected to an FET in the first branch.

BRIEF DESCRIPTION OF THE DRAWINGS

FIGS. 7 and 8 are prior-art G and P gates, respectively, for the second stage of the lookahead logic, utilizing negative-sense inputs and positive-sense outputs;

FIGS. 9 and 10 are circuits similar to those depicted in FIGS. 7 and 8, but utilizing positive-sense inputs and negative-sense outputs for use in the third stage of the lookahead logic;

FIGS. 11, 12, and 13 are prior-art gates utilized in three successive C-G sections of the lookahead logic of FIGS. 3 and 4;

DETAILED DESCRIPTION

Figure 1:
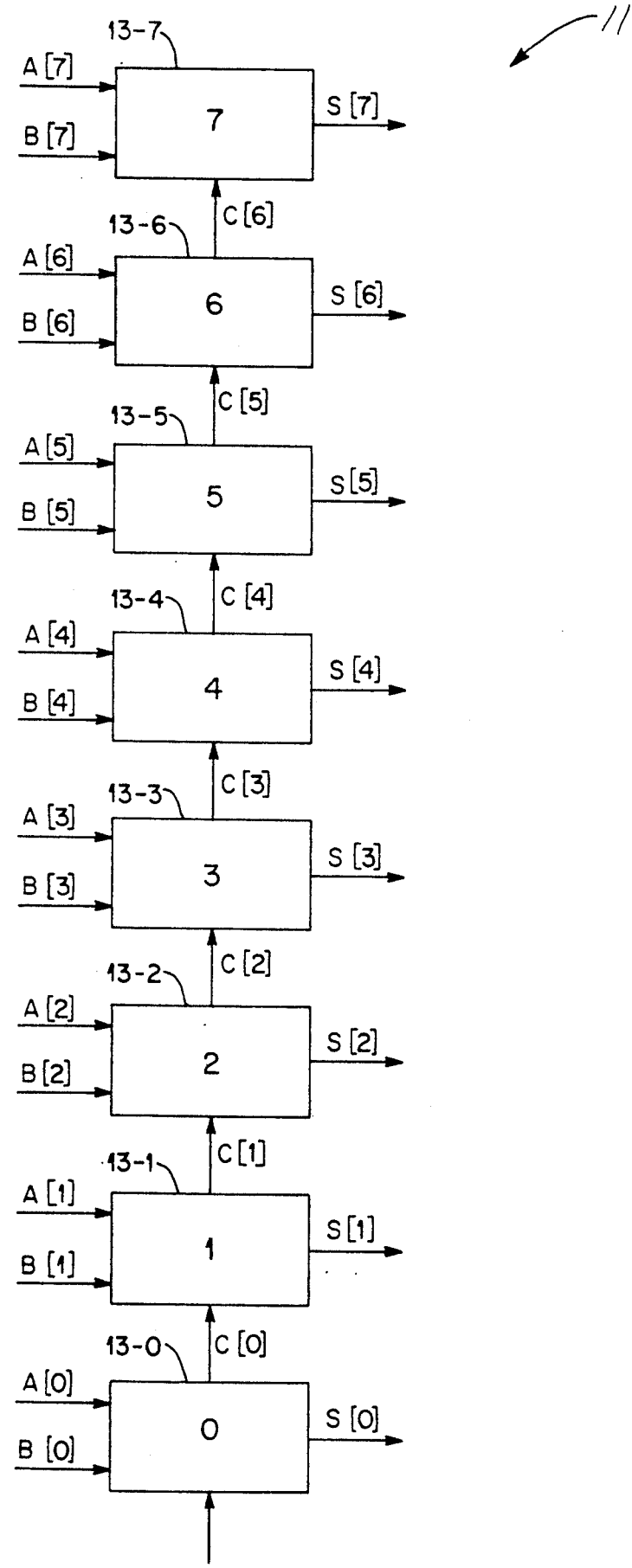
FIG. 1 is a block diagram of a prior-art ripple-carry adder.

An 8-stage, prior-art, ripple-carry adder 11 is illustrated in FIG. 1. Its first stage 13-0 takes the first bit of each of two 8-bit binary numbers A and B and produces a Sum (S) signal S[0] and a Carry (C) signal C[0]. The next seven stages 13-1 through 13-7 receive the progressively-more-significant digits of the A and B numbers, as well as the C signal of the previous stage. The outputs S[0] through S[7] collectively represent the outputs of the adder 11 and are functions of the input bits A[0] through A[7] and B[0] through B[7] in conjunction with the C signals C[0] through C[6]. Since each of the signals S[1] through S[7] is a function of the A and B signals to that stage, and the C signal C[0] from the previous stage, it can be seen that both series of signals C[0] through C[6] and S[1] through S[7] become available during successive time intervals, each interval representing the time that it takes for a given stage to generate its C and S outputs.

Figure 2:
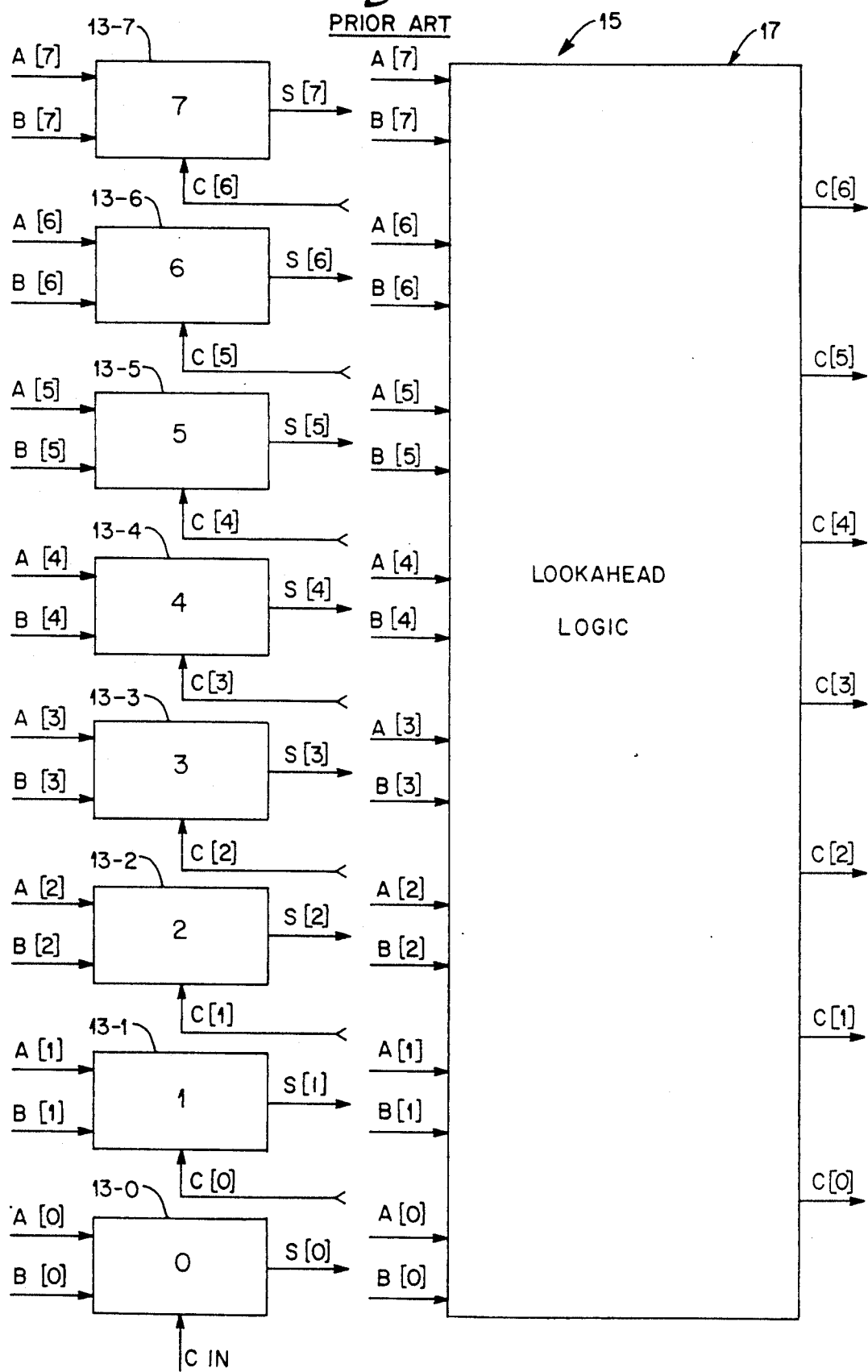
FIG. 2 is a block diagram of a prior-art lookahead adder.

A prior-art lookahead adder is illustrated, in general block form, in FIG. 2. It includes, in addition to the stages 13-0 through 13-7, a lookahead logic block 17. The outputs of the logic block 17 are the signals C[0] through C[6], which are derived directly from the adder input signals A[0]B[0] through A[7]B[7]. Because of the simultaneous or parallel mode of operation of the logic block 17, the C signals become available more rapidly than in the adder of FIG. 1. They are connected to the respective C inputs of successive adder stages in lieu of the C outputs generated by the adder stages as in FIG. 1.

Figure 3:
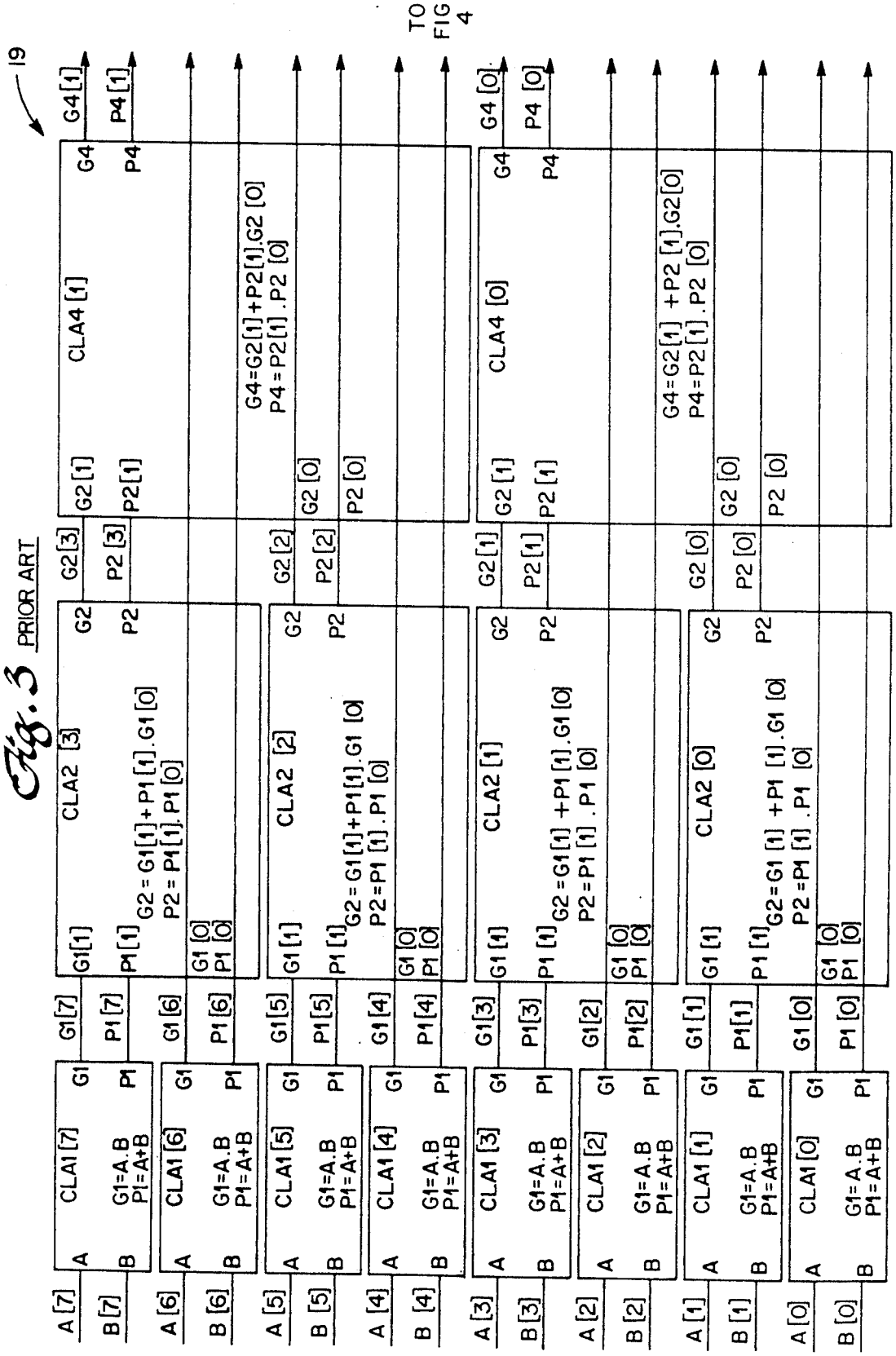
FIGS. 3 and 4 are block diagrams of the lookahead logic of the lookahead adder of FIG. 2.
Figure 4:
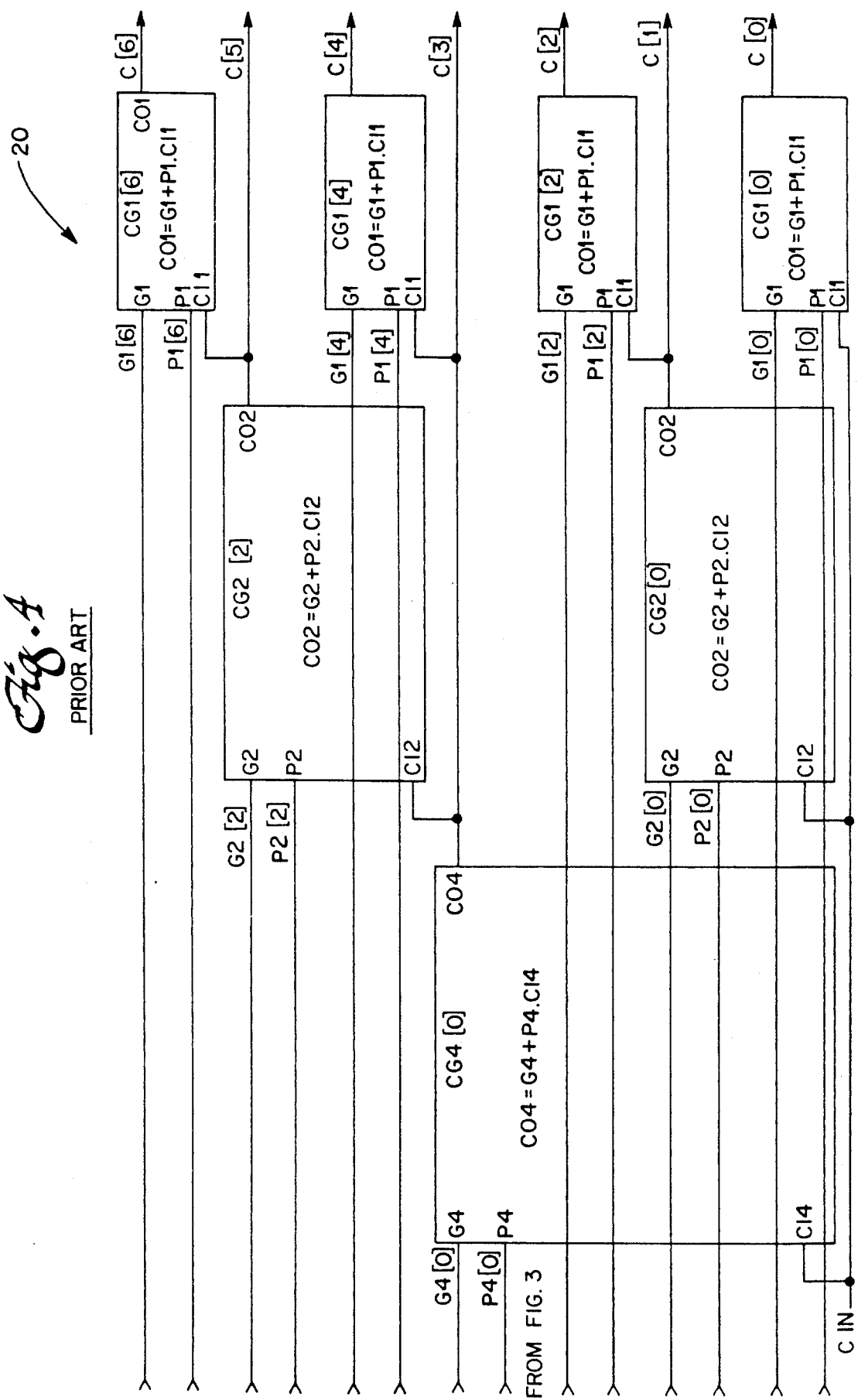

The logic circuit 17 is shown in greater detail in FIGS. 3 and 4. It comprises two principal portions: a G/P section 19 and a C-G section 20. The G/P section 19 comprises three stages, each having one-half as many operative elements as the preceding stage. Thus, the first stage comprises blocks CLA1[0] through CLA1[7]; the second stage, CLA2[0] through CLA2[3]; and the third stage, CLA4[0] and CLA4[1].

Each of the blocks CLA1 comprises two circuits, one performing the logic function $G1 = A \cdot B$, and the other, $P1 = A + B$. These circuits appear, respectively, in FIGS. 5 and 6. Each of the CLA2 blocks comprises a pair of circuits which implement the equations that they contain in FIG. 3. Each of them derives the information necessary to perform its logic function from a pair of the CLA1 block of circuits. The CLA2 circuit for carrying out the logic function for G2 is illustrated in FIG. 7, and that for performing the logic function for P2, is illustrated in FIG. 8.

The CLA2[0] and CLA2[1] blocks produce outputs which are received by the CLA4[0] block, and, similarly, the outputs of CLA2[2] and CLA2[3] are applied to the CLA4[1] block. The second block CLA4[1] of the third stage is included for illustration only, to show how the circuit of FIG. 19 would look if it were part of a larger adder, such as a 16-bit or 32-bit adder. In the 8-bit adder shown herein, CLA[1] is not used. Each of the blocks CLA4[0] and CLA4[1] generates a G4 and a P4 output, in accordance with the equations which they contain in FIG. 3, and their circuits for deriving G4 and P4 are shown, respectively, in FIGS. 9 and 10.

The individual circuits that comprise each of the various blocks CLA4, CLA2, and CLA1 will be additionally designated with a letter identifying whether it is a G or a P circuit. Accordingly, the G and P circuits which comprise a CLA1 block shall be identified as CLA1-G and CLA1-P; those comprising a CLA2 block, as CLA2-G and CLA2-P; and those comprising a CLA4 block, as CLA4-G and CLA4-P.

Figure 5:
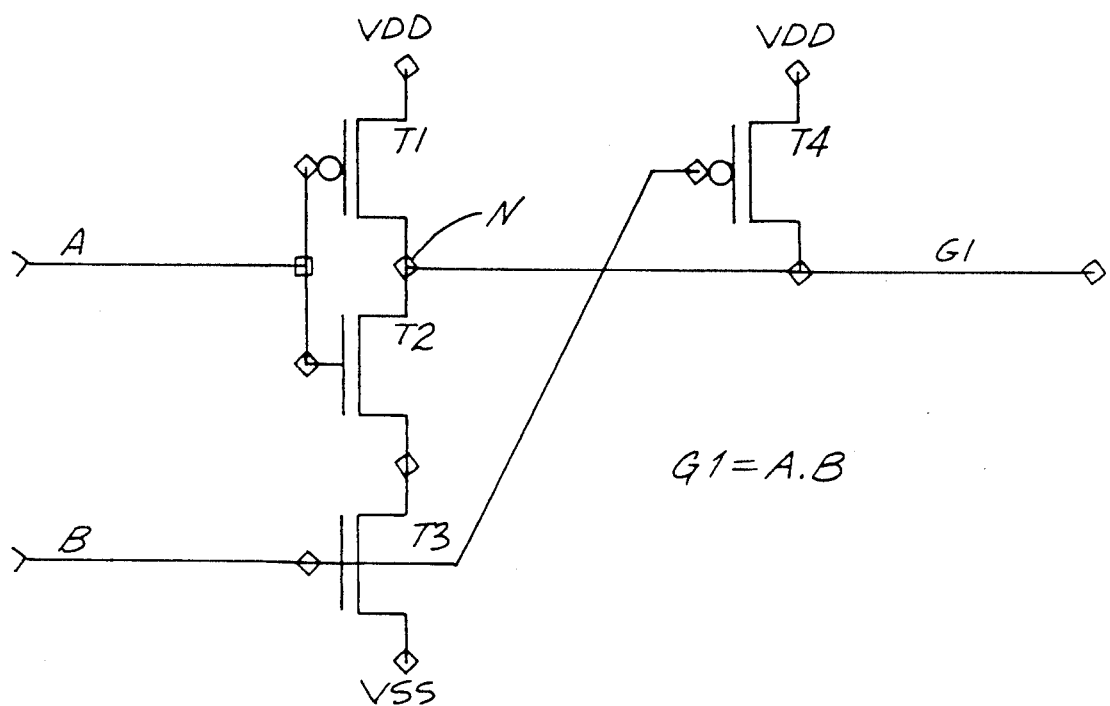
FIGS. 5 and 6 are prior-art G and P gates, respectively, for the initial stage of the lookahead logic, utilizing positive-sense inputs and negative-sense outputs.

The manner in which the logic circuits of FIGS. 5 and implement their respective functions is apparent by inspection, once the following conventions used for drawing the circuits are understood. Each of the elements next to the labels "T1" through "T6" is a Field Effect Transistor (FET). Each FET with a circle on its gate is a P conductivity type, and each without such a circle is an N conductivity-type. FET's whose gates are interconnected are of opposite conductivity types, and, therefore, application of a given logic signal to their interconnected gates causes one of them to turn on and the other to turn off. P-type FET's are turned on when their gates are pulled down to a negative level; N-type gates are turned on when their gates are pulled up to a positive level.

The G1 circuit of FIG. 5 is referred to as a "positive-sense circuit," because it responds to positive-sense (logic 1 high, logic 0 low) inputs and generates negative-sense (logic 1 low, logic 0 high) outputs. Thus, if logic 1 levels, i.e., positive-sense inputs, are applied to terminals A and B of the FIG. 5 G1 circuit, T1 and T4 are turned off, and T2 and T3 are turned on, causing the node N between T1 and T2 to be connected through T2 and T3 to $V_{SS}$, a negative voltage level, generating the predicted logic 1 (negative) output. Any input other than the combination just described would result in a logic 0 (positive) output level from the circuit.

Figure 6:
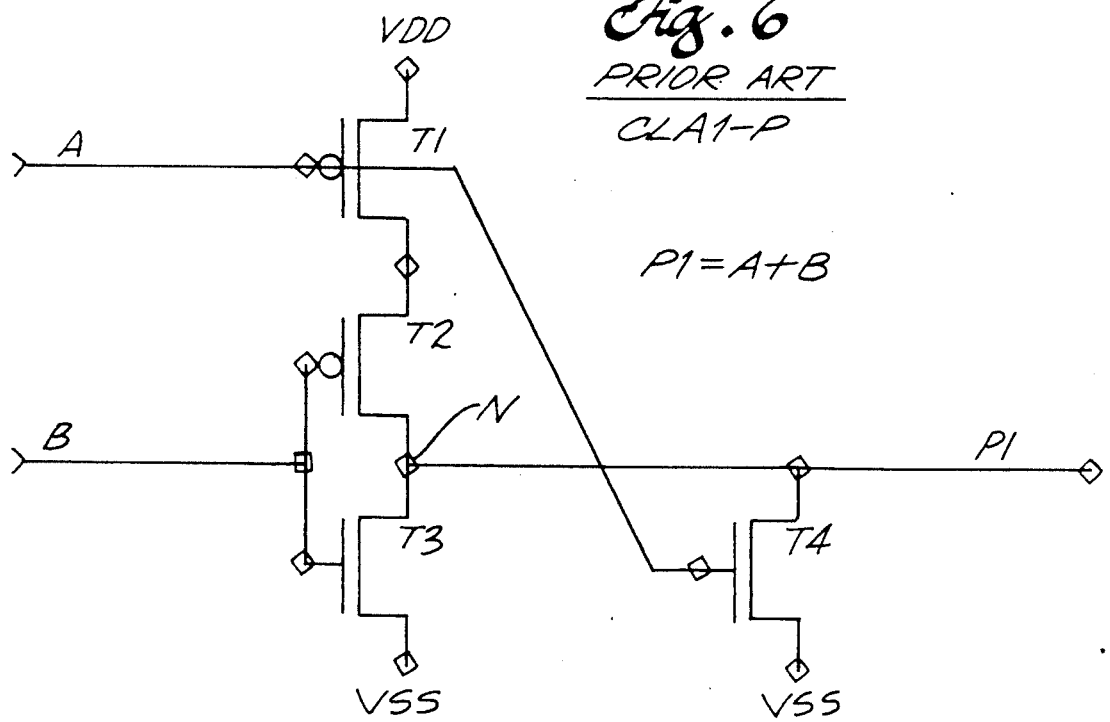

Inspection of the P1 circuit of FIG. 6 reveals that, if a logic 1 (negative) voltage level is applied to either its A or its B input, its output node N between FET's T2 and T3 is connected to the negative reference potential $V_{SS}$, resulting in a logic 1 output level. This is so because, if a logic 1 (positive) level is applied to the circuit on its input A, FET T1 turns off, and FET T4 turns on, pulling its output node (negative) to the level of the reference potential $V_{SS}$. Conversely, if a logic 1 level is applied to the B input of the circuit, T3 turns on, and T2 turns off, again resulting in a logic 1 output. In other words, either input will turn on one of the FET's T3 and T4, which connects the output node to the negative reference potential $V_{SS}$, and turns off one of the FET's T1 and T2, which are connected in series between that node and the positive reference potential $V_{DD}$, ensuring that the output node is cut off from VDD and connected only to $V_{SS}$, producing the predicted logic 1 level.

The CLA2-G circuit of FIG. 7 performs the logic function of equation (3). The circuit is comprised of first and second branches, each branch including first and second legs. The first and second legs of the first branch, respectively, comprise the series-connected FET's T1,T2 and T3,T4. The first and second legs of the second branch, respectively, include the FET's T5 and T6. The first legs of both branches are connected between the output node N of the circuit and the positive reference potential $V_{DD}$, while the second legs of both branches are connected between that node and the negative reference potential $V_{SS}$. The gate of each of the FET's T5 and T6, in a given leg of the second branch, is connected to that FET in the opposite leg of the first branch which is connected to one of the sources of reference potentials $V_{DD}$ and $V_{SS}$. In addition, the connection 25 is made between the FET's T3 and T6 in the second leg of the first and second branches, so as to connect them in parallel and so as to connect their parallel combination in series with the FET T4 in the second leg of the first branch.

The foregoing connections enable the circuit of FIG. 7 to perform the logical operation of equation (3). The circuit is of the negative-sense type, i.e., it operates with negative-sense inputs and generates a positive-sense output. The reason for this selection is to compensate for the voltage reversal between input and output of the preceding circuits CLA1-G and CLA1-P. Accordingly, a logic 1 (positive) output will appear at the output node of the CLA2-G circuit of FIG. 7 when either a logic 1 level is applied at its G1[1] input or logic 1 levels are applied to both its P1[1] and G1[0] inputs. In the case of the former, the negative input level at G1[1] turns off FET T4, cutting off both FET's T3 and T6 from possibly connecting the output node N to the negative reference potential $V_{SS}$ and turning on FET T5, enabling it to connect the output node to the positive reference potential $V_{DD}$. In the case of the latter, logic 1 levels are required on both the P1[1] and G1[0] inputs, since they are required to turn on the series combination of FET's T1 and T2, through which the node must be connected to the VDD reference potential, in the absence of an input to turn on the FET T5. The logic 1 levels on the P1[1] and the G1[0] inputs also serve to turn off FET's T3 and T6, again ensuring that the node will not be connected to $V_{SS}$ at the same time as FET's T1 and T2 are attempting to connect to the reference potential $V_{DD}$.

Operation of the FIG. 8 CLA2-P circuit may be readily understood, since it performs an AND gate function, like the FIG. 5 CLA1-G circuit, with the FET's T3 and T4 of FIG. 8 performing the role of FET's T1 and T4 of FIG. 5, and FET's T1 and T2 of FIG. 8 serving the function performed by FET's T2 and T3 of FIG. 5.

The circuits of FIGS. 9 and 10 perform exactly the same roles as the circuits of FIGS. 7 and 8, respectively, except that each of the FIG. 9 and 10 circuits is of the positive-sense type, producing negative-sense outputs from positive-sense inputs. With the outputs of the CLA2-G and CLA2-P circuits working into the corresponding inputs of the CLA4-G and CLA4-P circuits of FIGS. 9 and 10, it is necessary that the circuits 9 and 10 be of the opposite-sense type from those of FIGS. 7 and 8 to compensate for the sense reversal imposed by those stages. Thus, through the three CLA-G stages of FIGS. 5, 7, and 9, and the three CLA-P stages of FIGS. 6, 8, and 10, the logic level is returned, at the output of the last state, to that at the input of the first stage.

The second principal portion of the prior-art lookahead logic 17, the Carry-Generate (C-G) section 20, comprises circuits illustrated in FIGS. 11, 12, and 13. Since the CG4 circuit derives its input from the output of the CLA4 circuits of FIGS. 9 and 10, the CG4 circuit of FIG. 11 is selected to have negative-sense logic, and the CG2 and CG1 circuits of FIGS. 12 and 13, respectively, are selected to have positive- and negative-sense logic, for the reasons explained above.

The lookahead logic, as just described and connected as shown in FIGS. 3 and 4, is operative to generate at the CO4, CO2, and CO1 outputs of the CG4, CG2, and CG1 gates of FIGS. 11, 12, and 13, the C signals C[0] through C[6] required for operation of the lookahead adder. A shortcoming of the circuit as illustrated is the cross-connection 25 which appears in the CLA2-G, CLA4-G, CG4, CG2, and CG1 circuits of FIGS. 7, 9, 11, 12, and 13. In each such circuit, the cross-connection 25 causes one FET in each of the first and second branches of the circuit to be connected in series with an additional FET in the first branch, between the output node N of the circuit and one of the sources of reference potentials $V_{DD}$ and $V_{SS}$. For example, in the FIG. 7 CLA2-G circuit, the cross-connection 25 places FET's T3 and T6 in parallel with each other and in series with FET T4 in the first branch, across the output node N and the reference potential $V_{SS}$. Similarly, in the FIG. 9 CLA4-G circuit, the cross-connection 25 places the FET's T2 and T5 in parallel with each other and in series with FET T1 in the first branch, across the output node N and the reference potential $V_{DD}$.

It is apparent from the preceding explanation of the logic functions performed by these circuits, that the cross-connection 25 serves to implement the OR function of the equation for CLA2-G. However, the cross-connection, while necessary, is undesirable (a) because of the layout difficulties it causes, and (b) because connecting FET's such as T3 and T6 in FIG. 7 and their counterparts in the other similar circuits in question necessitates that the parallel-connected FET's be of similar size. This is so because, under certain logical conditions, the output node N may be connected to the $V_{SS}$ reference potential through the series combination of FET T4 (using FIG. 7 as an example) and either one of FET's T3 and T6. Since switching speed of the circuit is a function of the product of the resistance and capacitance of the circuit being switched, and since it is desired that the switching speed not be a function of whether T3 or T6 is turned on, it is good design practice to make FET's T3 and T6 of comparable size, in order that they have comparable resistances. Were it not for the fact that FET T6 needs to have the same resistance as FET T3 with which it is parallel, it could be made smaller—a distinct advantage.

Figure 14:
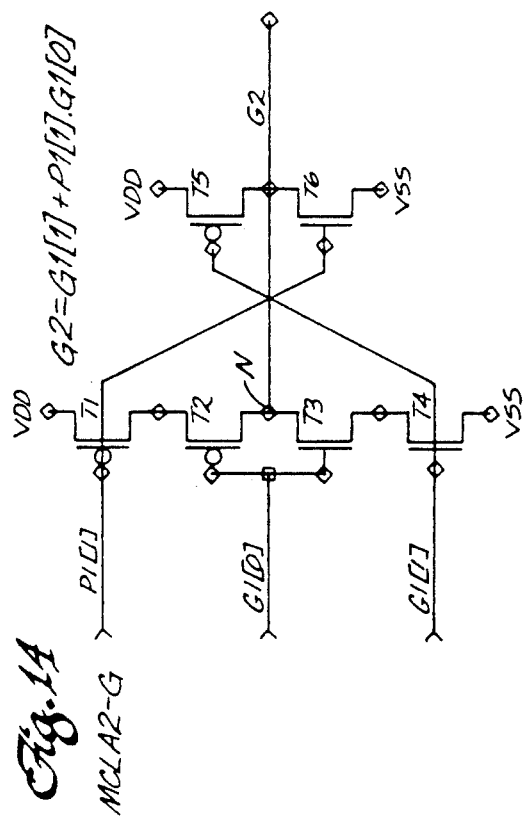
FIGS. 14 and 15 are G and P gates, respectively, used in the second stage of the G/P section of the lookahead logic and incorporating features of the present invention.

In accordance with the invention and with specific reference, still, to FIG. 7, the cross-connection 25 between FET's T3 and T6 is removed and FET T6 is instead connected to reference potential $V_{SS}$. A circuit so modified is illustrated in FIG. 14 and labelled "MCLA2-G." Similarly modified versions of the CLA4-G, CG4, CG2, and CG1 circuits of FIG. 9, 11, 12, and 13 appear as the circuits labelled "MCLA4-G" (FIG. 16), "MCG4" (FIG. 18), "MCG2" (FIG. 19), and "MCG1" (FIG. 20). Referring, again, for specific example to FIGS. 7 and 14, wherein are shown the CLA2-G circuit and its modified version MCLA2-G, it is seen that, in the FIG. 14 circuit, FET T6 in the second branch is now connected in parallel across the series combination of FET's T3 and T4 in the first branch. Since the combined resistance of those two FET's, T3 and T4, is approximately double that of FET T3 alone, it follows that FET T6 in the MCLA2-G circuit of FIG. 14 may have a resistance which is approximately twice that of its counterpart in the CLA2-G circuit of FIG. 7, permitting a significant reduction in the size of FET T6. The same advantage also pertains to the circuits of FIGS. 16, 18, 19, and 20.

The modification described with reference to FIGS. 7 and 14 results in a potential problem, which is overcome by a second circuit modification in accordance with the invention. The potential problem is that, since the FET T6 of the MCLA2-G (modified) circuit is no longer connected in series with another FET, it is possible, under certain circumstances, for the inputs to the circuit to turn on both T5 and T6, and thereby connect the output node N of the circuit to both of the reference potentials $V_{DD}$ and $V_{SS}$—a condition referred to as "drive fight," since the FET's T5 and T6 are "fighting"

each other for control of the output node. This situation could not occur with the prior-art circuit CLA2-G of FIG. 7 because, even if the FET's T5 and T6 were turned on simultaneously, under those circumstances the FET T4 would be cut off and, hence, the connection from the reference potential $V_{SS}$ to the output node N would not be completed through the FET T6.

To overcome this potential problem, a modification is made to the CLA-P circuits which drive the modified MCLA-G and MCG logic circuits so as to prevent the combination of logic inputs which could give rise to a drive fight. The condition which is capable of initiating drive fight is when, in the case of the FIG. 14 circuit, its P1[1] and G1[1] logic inputs are each of a sense which is operative to turn on respective ones of the FET pair T5,T6, i.e., when P1[1] is a logic 0 and G1[1] is a logic 1. This condition cannot occur at the outputs of the CLA1 circuits, because no combination of A and B inputs to a GLA1 circuit can cause its P1 output to be a logic 0 when its G1 output is a logic 1. This is apparent from the following Table I, which is the truth table for the CLA1-G and CLA1-P circuits of FIGS. 5 and 6.

TABLE I

| A | B | G1 | P1 |
|---|---|----|----|
| 0 | 0 | 0  | 0  |
| 0 | 1 | 0  | 1  |
| 1 | 0 | 0  | 1  |
| 1 | 1 | 1  | 1  |

Consequently, the MCLA2-G circuit can be safely used without modifying any of the circuits connected to its inputs. The problem occurs at the next stage to which the outputs of the CLA2-G and CLA2-P of FIGS. 7 and 8 would be applied, in particular, the MCLA4-G circuit of FIG. 16. This can be seen from the following truth table, in which the column headings denote the inputs to and outputs from the CLA2-G and CLA2-P circuits of FIGS. 7 and 8.

TABLE II

| Case No. | G1[1] | P1[1] | G1[0] | P1[0] | G2* | P2* |
|----------|-------|-------|-------|-------|-----|-----|
| 1  | 0 | 0 | 0 | 0 | 0 | 0 |
| 2  | 0 | 0 | 0 | 1 | 0 | 0 |
| 3  | 0 | 0 | 1 | 0 | — | — |
| 4  | 0 | 0 | 1 | 1 | 0 | 0 |
| 5  | 0 | 1 | 0 | 0 | 0 | 0 |
| 6  | 0 | 1 | 0 | 1 | 0 | 1 |
| 7  | 0 | 1 | 1 | 0 | — | — |
| 8  | 0 | 1 | 1 | 1 | 1 | 1 |
| 9  | 1 | 0 | 0 | 0 | — | — |
| 10 | 1 | 0 | 0 | 1 | — | — |
| 11 | 1 | 0 | 1 | 0 | — | — |
| 12 | 1 | 0 | 1 | 1 | — | — |
| 13 | 1 | 1 | 0 | 0 | 1 | 0 |
| 14 | 1 | 1 | 0 | 1 | 1 | 1 |
| 15 | 1 | 1 | 1 | 0 | — | — |
| 16 | 1 | 1 | 1 | 1 | 1 | 1 |

*G2 = G1[1] + P1[1]·G1[0]
P2 = P1[1]·P1[0]

Figure 16:
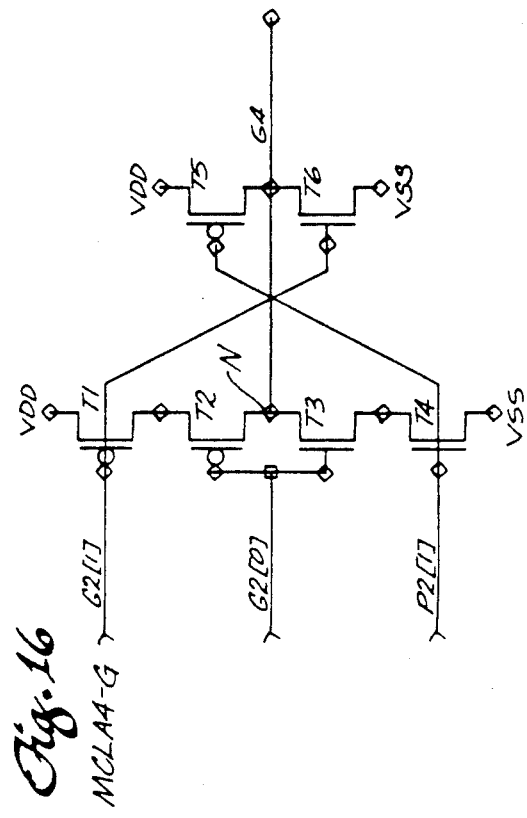
FIGS. 16 and 17 are G and P gates used in the third stage of the lookahead logic utilizing features of the present invention.

It can be determined from an inspection of the above Table II that there is one set of conditions which will cause a 1 output to appear at the G2 output of the FIG. 7 CLA2-G circuit at the same time when a 0 output appears at the P2 output of the FIG. 8 CLA2-P circuit, causing a drive fight in the T5 and T6 FET's of the next-stage MCLA4-G circuit of FIG. 16. Actually, there are several permutations which appear in the above Table II whose result might be and 1 and 0 outputs for G2 and P2, respectively, if those conditions could occur. However, they cannot, for the following reasons. First, cases 3, 7, 9-12, and 15 are impossible because they require, in each instance, that G1[0] be 1 when P1[0] is 0 or that G1[1] be 1 when P1[1] is 0.

It has been shown above, with reference to Table I, that this set of conditions cannot occur, and, therefore, cases 3, 7, 9-12, and 15 can be ignored. That leaves nine possible cases that need to be examined for the presence of the condition which must be prevented. Of those, namely, cases 1, 2, 4-6, 8, 13, 14, and 16, only one, case 13, presents the condition which needs to be prevented, that is, that G2 is 1 when P2 is 0.

The measure which is taken in accordance with the present invention serves to prevent the generation of simultaneous logic 1 G2 and logic 0 P2 outputs, in the event that the combination of inputs indicated by case 13 in Table II should occur. As will be shown, the condition is prevented by modifying the term for P2. In particular, there is added to the expression for P2 the term "G1[1]," resulting in the following expression for MCLA2-P: P2 = G1[1] + P1[1]·P1[0]. It will be shown not only that addition of the "G1[1]" term avoids the logic 1 G2, logic 0 P2 combination in the event that case 13 should occur, but that addition of that term does not disturb the proper functioning of the circuit so modified. In other words, the MCLA2-P circuit of FIG. 15, which implements the modified equation for P2, is operative to produce, in response to the signals at its input, the P2 signal on its output under the same set of conditions as its prior-art counterpart, the CLA2-P circuit of FIG. 8. Only the offending case 13 is eliminated. No other valid cases are disturbed.

Table III below shows the truth of the foregoing proposition. It shows that, for all possible conditions, that is, cases 1, 2, 4-6, 8, 13, 14, and 16, the outputs G2 and P2 are the same as they are for the equations expressed in Table III, except for case 13, for which both G2 and P2 are a logic 1. In short, addition of the term "G1[1]" to the equation for P2 is operative to eliminate case 13, the only case resulting in drive fight in a stage which receives the P2 output of the modified circuit without disturbing the output of the circuit in any other logically possible case.

TABLE III

| Case No. | G1[1] | P1[1] | G1[1] | P1[0] | G2* | P2* |
|----------|-------|-------|-------|-------|-----|-----|
| 1  | 0 | 0 | 0 | 0 | 0 | 0 |
| 2  | 0 | 0 | 0 | 1 | 0 | 0 |
| 3  | 0 | 0 | 1 | 0 | — | — |
| 4  | 0 | 0 | 1 | 1 | 0 | 0 |
| 5  | 0 | 1 | 0 | 0 | 0 | 0 |
| 6  | 0 | 1 | 0 | 1 | 0 | 1 |
| 7  | 0 | 1 | 1 | 0 | — | — |
| 8  | 0 | 1 | 1 | 1 | 1 | 1 |
| 9  | 1 | 0 | 0 | 0 | — | — |
| 10 | 1 | 0 | 0 | 1 | — | — |
| 11 | 1 | 0 | 1 | 0 | — | — |
| 12 | 1 | 0 | 1 | 1 | — | — |
| 13 | 1 | 1 | 0 | 0 | 1 | 1 |
| 14 | 1 | 1 | 0 | 1 | 1 | 1 |
| 15 | 1 | 1 | 1 | 0 | — | — |
| 16 | 1 | 1 | 1 | 1 | 1 | 1 |

*G2 = G1[1] + P1[1]·G1[0]
P2 = G1[1] + P1[1]·P1[0]

The circuit implementation of the above modification has a surprising and extremely advantageous result: whereas the prior-art CLA-G and CLA-P circuits (such as FIGS. 7 and 8) are different, since they implement different logical expressions, the improved MCLA-G and MCLA-P circuits (such as FIGS. 14 and 15) are identical. This result comes about from the addition of the "G1[1]" term to the equation for P2, which gives the equation for P2 exactly the same form as that for G2, except for the fact that, in the equation for P2, the term "P1[0]" replaces the term "G1[0]" of the equation for G2. Consequently, the FIG. 15 MCLA2-P circuit is identical to the FIG. 14 MCLA2-G circuit, the only difference between the two being that the G1[0] input on the gates of T2 and T3 in FIG. 14 finds its counterpart as the P1[0] input to the gates of T2 and T3 in FIG. 15.

The same modifications which have just been explained with reference to the circuits in the CLA2 blocks are also made in the CLA4 blocks, the resulting circuits appearing in FIGS. 16 and 17 as MCLA4-G and MCLA4-P.

Figure 15:
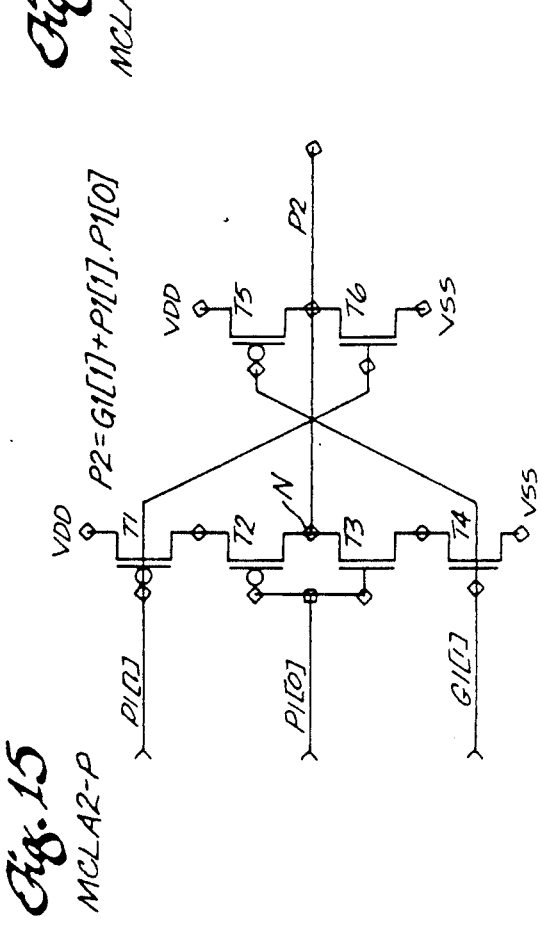

It will be noted that the above-described modifications have a further surprising result. In the prior-art CLA2 and CLA4 blocks, the CLA2-G and CLA4-G gates are different, because of the need to alternate positive- and negative-sense gates in successive stages. Because of the asymmetrical nature of the CLA2-G and CLA4-G gates of FIGS. 7 and 9, this sense-alternation could not be accomplished simply by switching inputs; it had to be accomplished by making them structurally different, as is clearly seen by comparing them. The same limitation does not exist with the gates improved according to the present invention. Because the gates MCLA2-G and MCLA4-G of FIGS. 14 and 16 are symmetrical about their central output nodes N, they can be made to function as opposite-polarity-sense circuits simply by reversing the location of the inputs to their T1 and T4 FET's. As a result, not only has the invention succeeded in making identical the CLA-G and CLA-P circuits of a given stage, such as, for example, the MCLA2-G and MCLA2-P circuits of FIGS. 14 and 15, it has also succeeded in allowing the CLA-G circuits of successive stages, such as, for example, MCLA2-G and MCLA4-G of FIGS. 14 and 16, to be made identical. The same also applies to the MCLA-P circuits, for the same reason. As a result, the MCLA-P circuits of successive stages, such as, for example, MCLA2-P and MCLA4-P of FIGS. 15 and 17, are identical except for the reversal of the logic signals on their T1 and T4 FET inputs. From the above, it follows that all of the G and P circuits, in all stages of the G/P logic after the first stage, can be identical, each of them performing the logic function $M = X + Y \cdot Z$, where M, X, Y, and Z are all binary values.

The same simplification which has been demonstrated with respect to the G/P section 19 of the lookahead logic circuit 17 can also be implemented in the C-G section 20 of the lookahead logic. This is so because the form of the equation implemented by the C-G blocks CG4, CG2, and CG1 of FIG. 20 is the same as the form of the equations implemented by the G circuits of the CLA2 and CLA4 blocks.

A comparison of the circuits of the two sections 19 and 20 of the lookahead circuit 17 will be instructive. The prior-art CG4 circuit of FIG. 11 is identical to the prior-art CLA2-G circuit of FIG. 7. The CG4 circuit of FIG. 11 works with the outputs of the CLA4-G circuit of FIG. 9, but is configured like the CLA2-G circuit of FIG. 7, i.e., is of the opposite-sense type, in order to continue the polarity-reversal scheme which cancels out the sense reversals in successive stages of the logic circuit 17. For the same reason, the prior-art CG2 circuit of FIG. 12, which receives its inputs from the prior-art CLA2-G circuit of FIG. 7, is of the oppositesense type from the CLA2-G circuit and is identical to the CLA4-G circuit of FIG. 9. It follows from the above that the prior-art CG2 circuit of FIG. 12 may be modified in accordance with the invention in exactly the same manner as was just described with reference to FIG. 9 and its prior-art CLA4-G circuit. Similarly, the prior-art CG4 and CG1 circuits of FIGS. 11 and 13 may be modified in exactly the same manner as that described for the prior-art CLA2-G circuit of FIG. 7. The resulting circuits constructed in accordance with the present invention are the MCG4 circuit of FIG. 18, replacing the CG4 circuit of FIG. 11; the MCG2 circuit of FIG. 19, replacing the CG2 circuit of FIG. 12; and the MCG1 circuit of FIG. 20, replacing the CG1 circuit of FIG. 13.

Figure 17:
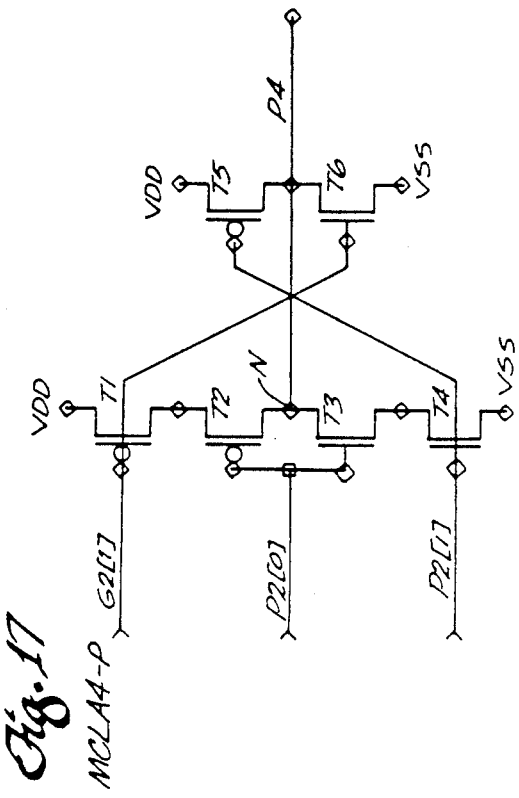
Figure 18:
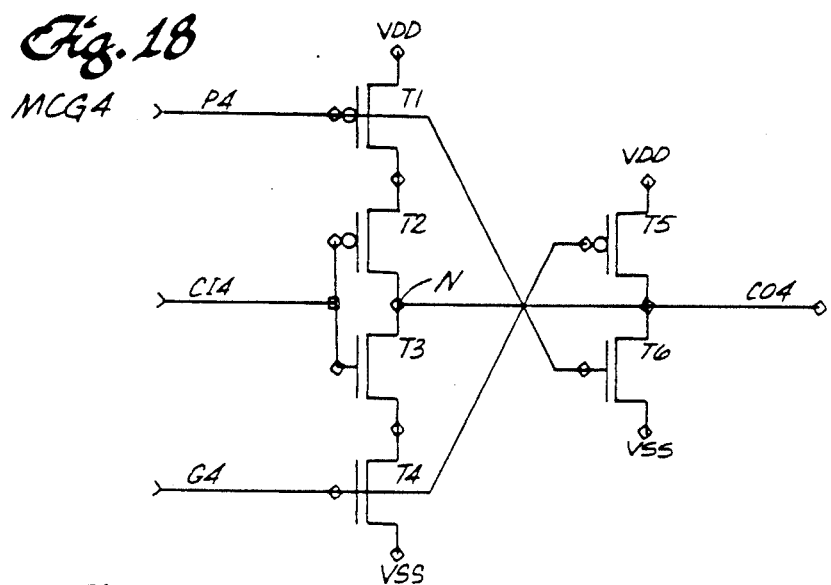
FIGS. 18, 19, and 20 are, respectively, C-G gates used in the first, second, and third stages of the C-G section of the lookahead logic and configured in accordance with the present invention.
Figure 19:
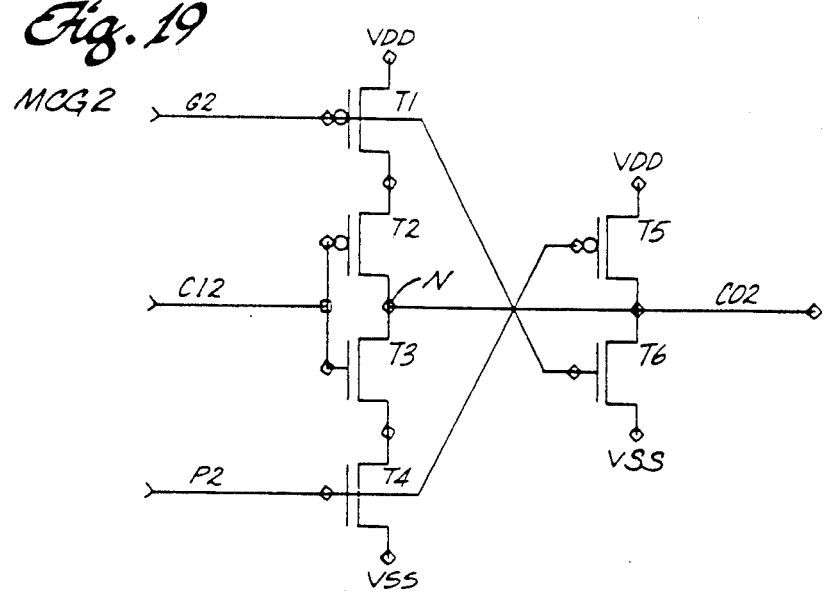
Figure 20:
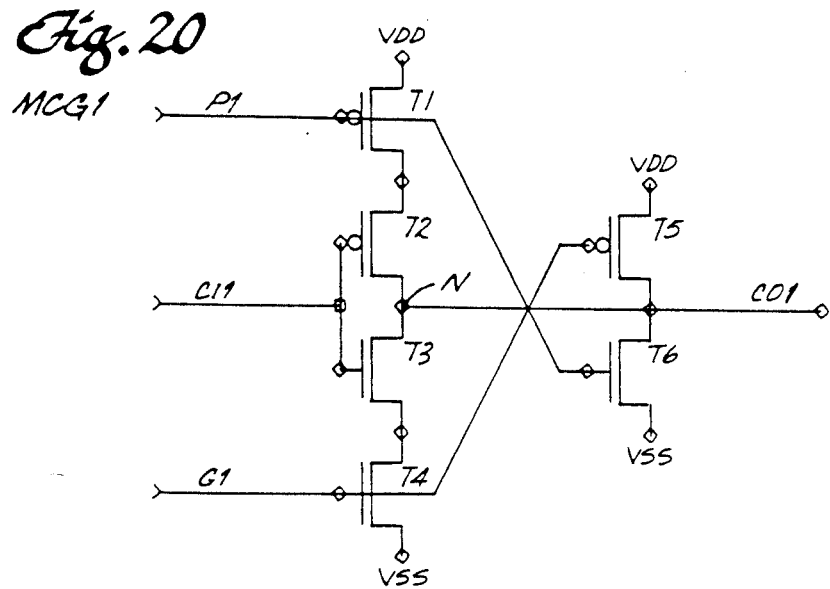

It will be noted that each of the circuits MCG4, MCG2, and MCG1 of FIGS. 18, 19, and 20 receives its P input either from one of the CLA1-P circuits of FIG. 6, or from one of the MCLA2-P circuits of FIG. 15, or from one of the MCLA4-P circuits of FIG. 17. Since the CLA1-P circuits do not give rise to drive fight, and since the MCLA2-P and MCLA4-P circuits have already been modified to eliminate the possibility of drive fight in succeeding stages of the G/P section 19, it will be seen that the MCG4, MCG2, and MCG1 circuits of FIGS. 18, 19, and 20 will also operate satisfactorily without possibility of drive fight.

The foregoing circuit improvements have been described with reference to an 8-stage adder. It will be understood that the 8-stage adder used to explain the present invention is not the adder of typical size in today's computer technology. More likely, the invention will be used in a 32-bit adder, of which the adder illustrated in FIGS. 2, 3, and 4 is a one-quarter part. Thus, it will be understood that, whereas, in the illustrated example, the G4[1],P4[1] outputs of the CLA4[1] stage of FIG. 19 are not being used, they would indeed be used, were the illustrated circuit merely a part of a larger circuit serving a 32-bit adder. In such a larger circuit, there would be 31 CLA1 blocks, 15 CLA2 blocks, seven CLA4 blocks, three CLA8 blocks, a single CLA16 block, and a corresponding increase in the number of blocks in the C-G section 20 of the logic circuit 17. In such a circuit, the output of the CLA4[1] block would be used as one of two sets of inputs to the next-higher-order block CLA8[0], whose other pair of inputs would come from the CLA4[0] block. It is evident that, by use of the present invention, such larger adders and, in particular, their lookahead logic circuits, can be simplified in a manner even more dramatic than that illustrated in the present application, by making identical all of their (much more numerous) gates (following those in the initial G/P stage).

From the foregoing, it is apparent that there has been provided a circuit improvement in lookahead adders which has resulted in both improving and simplifying the lookahead logic of such adders. The improvement has been effected by making it possible to reduce the size and, hence, capacitance and time delay of the output FET sections of the logic gates. Simplification has been achieved by virtue of the fact that the aforesaid modification results in almost all of the G/P and C-G circuits becoming identical.

What is claimed is:

1. A multi-stage lookahead adder having a plurality of generate and propagate field effect transistor (FET) circuits arranged in successive lookahead stages, with the outputs of generate and propagate circuits of a given lookahead stage being connected as inputs to generate and propagate circuits of a following lookahead stage, and characterized in that all but the initial stage of said generate circuits are identical and in that each said identical generate circuit has a central output node about which said generate circuit is symmetrical as to circuit configuration, with FET's in corresponding positions in opposite halves of said generate circuit having opposite conductivity types.

2. A multi-stage lookahead adder having a plurality of generate and propagate field effect transistor (FET) circuits arranged in successive lookahead stages, with the outputs of generate and propagate circuits of a given lookahead stage being connected as inputs to generate and propagate circuits of a following lookahead stage, and characterized in that all but the initial stage of said generate circuits are identical and in that each of said identical generate and propagate circuits has a central node about which said generate circuit is symmetrical as to circuit configuration, with FET's in corresponding positions in opposite halves of said generate and propagate circuits having opposite conductivity types.

3. The multi-stage lookahead adder of claim 2, wherein each of said identical generate and propagate circuits performs the logical function $M = X + Y \cdot Z$, where M, X, Y and Z are binary values.

4. A multi-stage lookahead adder having a plurality of generate and propagate field effect transistor (FET) circuits arranged in successive lookahead stages, with the outputs of generate and propagate circuits of a given lookahead stage being connected as inputs to generate and propagate circuits of a following lookahead stage, and characterized in that all but the initial stage of said generate circuits are identical and in that the generate circuits in all but the first said lookahead stage comprise:
  a) an output node;
  b) first and second branches of series-connected FET's connected in parallel between first and second sources of reference potential;
  c) said first and second branches each comprising first and second sub-branches, respective sub-branches in each branch being connected directly across respective ones of said first and second reference potentials and said output node; and
  d) at least one FET in each sub-branch of the second branch having its gate connected to an FET in the first branch.

5. The multi-stage lookahead adder of claim 4, wherein each FET in a sub-branch of the second branch connected between said node and a given one of said reference potentials is connected to the gate of an FET in a sub-branch of the first branch connected between said node and the other one of said reference potentials.

6. The multi-stage lookahead adder of claim 5, wherein:
  a) each sub-branch of said first branch comprises first and second series-connected FET's, the first FET of each said pair being connected to a respective one of said reference potentials, and the second FET of each said pair being connected between the first FET of each said pair and said node; and
  b) each sub-branch of said second branch comprises a single FET connected between a respective one of said reference potentials and said node, with the gates of the FET's in respective ones of said first and second sub-branches of said second branch being connected to the gates of the first FET's in the second and first sub-branches of said first branch, respectively.

7. A multi-stage lookahead adder having a plurality of generate and propagate field effect transistor (FET) circuits arranged in successive lookahead stages, with the outputs of generate and propagate circuits of a given lookahead stage being connected as inputs to generate and propagate circuits of a following lookahead stage, and characterized in that all but the initial stage of said generate circuits are identical and in that the propagate circuits in any given lookahead stage after said first lookahead stage are identical to the generate circuits in that given stage, and wherein all generate circuits in such given stages receive as their inputs the outputs of generate and propagate circuits of a preceding lookahead stage.

8. For use in a multi-stage lookahead adder's lookahead logic having a plurality of generate and propagate field effective transistor (FET) circuits arranged in successive lookahead stages, with the outputs of generate and propagate circuits of a given lookahead stage connected as inputs to generate and propagate circuits of a following lookahead stage, a universal circuit capable of serving as either a propagate circuit or a generate circuit in all but the first lookahead stage comprising:
  a) an output node;
  b) first and second branches of series-connected FET's connected in parallel between first and second sources of reference potential;
  c) said first and second branches each comprising first and second sub-branches, respective sub-branches in each branch being connected between respective ones of said first and second reference potentials and said output node; and
  d) at least one FET in each sub-branch of the second branch having its gate connected to an FET in the first branch.

9. The universal circuit of claim 8, wherein each FET in a leg of the second branch connected between said node and a given one of said reference potentials is connected to the gate of an FET in a sub-branch of the first branch connected between said node and the other one of said reference potentials.

10. The universal circuit of claim 9, wherein:
  a) each sub-branch of said first branch comprises first and second series-connected FET's, the first FET of each said pair being connected to a respective one of said reference potentials, and the second FET of each said pair being connected between the first FET of each said pair and said node; and
  b) each sub-branch of said second branch comprises a single FET connected between a respective one of said reference potentials and said node, with the gates of the FET's in respective ones of said first and second sub-branches of said second branch being connected to the gates of the first FET's in the second and first sub-branches of said first branch, respectively.

* * * * *